(12) United States Patent
Han et al.

(10) Patent No.: US 10,103,000 B2
(45) Date of Patent: Oct. 16, 2018

(54) DOUBLE-TILT SAMPLE HOLDER FOR TRANSMISSION ELECTRON MICROSCOPE

(71) Applicant: BEIJING UNIVERSITY OF TECHNOLOGY, Beijing (CN)

(72) Inventors: Xiaodong Han, Beijing (CN); Jianfei Zhang, Beijing (CN); Mao Shengcheng, Beijing (CN); Yadi Zhai, Beijing (CN); Xiaodong Wang, Beijing (CN); Zhipeng Li, Beijing (CN); Xiaochen Li, Beijing (CN); Taonan Zhang, Beijing (CN); Dongfeng Ma, Beijing (CN); Ze Zhang, Beijing (CN)

(73) Assignee: BEIJING UNIVERSITY OF TECHNOLOGY, Beijing (CN)

( * ) Notice: Subject to any disclaimer, the term of this patent is extended or adjusted under 35 U.S.C. 154(b) by 70 days.

(21) Appl. No.: 15/387,529

(22) Filed: Dec. 21, 2016

(65) Prior Publication Data
US 2017/0301510 A1    Oct. 19, 2017

(30) Foreign Application Priority Data

Apr. 17, 2016  (CN) .......................... 2016 1 0237949
Apr. 17, 2016  (CN) ..................... 2016 2 0321337 U

(51) Int. Cl.
*H01J 37/20*  (2006.01)
*H01J 37/26*  (2006.01)

(52) U.S. Cl.
CPC .............. *H01J 37/20* (2013.01); *H01J 37/26* (2013.01); *H01J 2237/206* (2013.01);
(Continued)

(58) Field of Classification Search
CPC .... H01J 37/20; H01J 37/26; H01J 2237/2001; H01J 2237/26; H01J 2237/2802;
(Continued)

(56) References Cited

U.S. PATENT DOCUMENTS

| | | | | |
|---|---|---|---|---|
| 2007/0063148 | A1* | 3/2007 | Miyazaki ................ | H01J 37/20 250/442.11 |
| 2012/0119109 | A1* | 5/2012 | Kim ........................ | H01J 37/20 250/442.11 |

* cited by examiner

*Primary Examiner* — David E Smith
*Assistant Examiner* — Hsien Tsai
(74) *Attorney, Agent, or Firm* — J.C. Patents

(57) ABSTRACT

A double-tilt sample holder for TEM, comprising: it comprise the main body of sample holder body, front-end tilt stage, drive rod, linkage, tilt axis, rotation axis, fixed axis of drive rod and sample loading stage. The axis hole is arranged at the front-end tilt stage, which is connected to the main body of the sample holder body by the tilt axis. The linkage, the boss slot and the drive rod slot are connected by the rotation axis. Two through movement guide grooves are designed symmetrically at both sides of the front-end of sample holder body, and the drive rod is fixed by the fixed axis of the drive rod, which restricts the drive rod to move reciprocally in a straight line driven by the linear stepping motor at the back-end of the main body of the holder body, further leading the tilt stage to rotate around the tilt axis. The tilt angle of the sample loading stage can be precisely controlled by the high precision linear stepping motor in the apparatus. The maximum tilt angle of the sample stage can be adjusted by the included angle between the boss at the bottom surface of the front-end tilt stage and the horizontal direction and the length of the movement guide groove in the apparatus. The apparatus can be used coordinately with TEM and its universality is wide.

1 Claim, 5 Drawing Sheets

Figure 1:
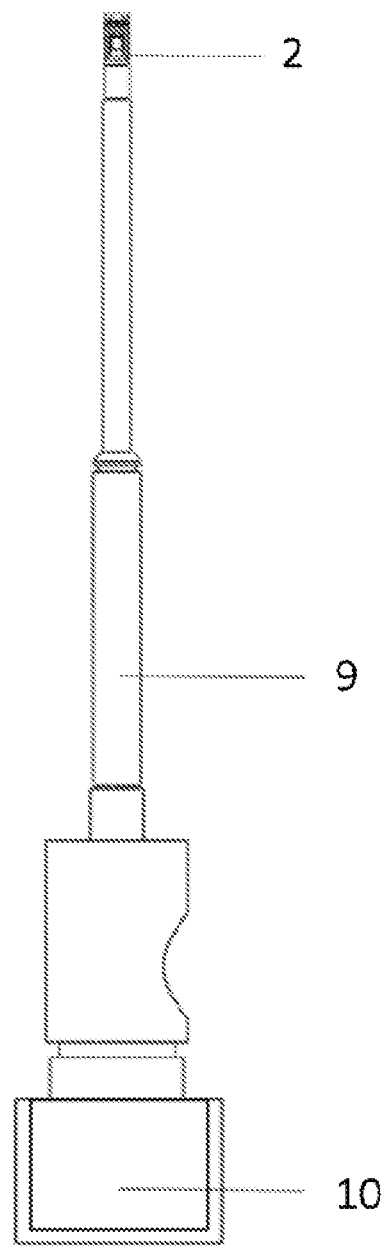

(52) U.S. Cl.
CPC ............... *H01J 2237/20207* (2013.01); *H01J 2237/20278* (2013.01); *H01J 2237/262* (2013.01)

(58) Field of Classification Search
CPC ..... H01J 2237/20207; H01J 2237/2007; H01J 2237/20214; H01J 2237/206; H01J 2237/2065; H01J 2237/2062; G21K 5/08; G02B 21/26
See application file for complete search history.

DOUBLE-TILT SAMPLE HOLDER FOR TRANSMISSION ELECTRON MICROSCOPE

CROSS-REFERENCE TO RELATED APPLICATION

This application claims the priority benefit of Chinese application serial No. 201610237949.2, filed on Apr. 17, 2016 and Chinese application serial No. 201620321337.7, filed on Apr. 17, 2016. The contents of the two Chinese applications are hereby incorporated by reference in their entirety and made a part of this specification.

TECHNICAL FIELD

The invention relates to a sample holder which has a new type mode of double-tilt for transmission electron microscope (TEM), by which the observation of material microstructure under atomic lattice resolution can be realized, and the invention belongs to the field of TEM accessories.

BACKGROUND ART

The scientific theory, preparation and processing level of materials have become the restrict elements of one nation's scientific and technological progress. The macro properties of the materials depend on their microstructure. Transmission electron microscopy (TEM) is the important equipment characterizing the material microstructure, and as one of the important components of TEM, the sample holder acts the function of loading samples and applying on the samples multi-physics field such as the role of force, thermal, electricity, light and like. At present, higher requirements for TEM and its in-situ technology are put forward with the in-depth study on materials science, and it has become a hot spot of research how to realize the observation of in-situ double-axis tilt of TEM while the external field function is applied on the materials.

According to the mode of tilt, the current commercialized TEM sample holder can be divided into two kinds of single-axis tilt and double-axis tilt. The rotation along the holder shaft is X axis rotation, and the rotation perpendicular to the holder body and the incidence direction of the electron beam is Y axis rotation. Generally, the X axis rotation is realized by goniometer stage for TEM, while the Y axis rotation should be realized by rotating sample loading stage on the sample holder. The current commercialized sample holders, such as: the single-tilt sample holder of Gatan company 613 type, 628 type and 643 type and FEI company SH30 type and SH70 type, can only rotate along X axis and are usually used for the observation of the material diffraction contrast. At the same time, the functions of heating, cooling and mechanical tests (stretch or compression) and like can be realized by some commercialized single-tilt holder, such as Hysitron company PI 95 single-tilt force bar. Although the TEM in-situ mechanical experiment can be carried out and the precise mechanical parameters can be obtained by PI 95, the single-tilt function cannot ensure the electron beam incidence along the low index crystal face of the sample, and therefore clear electron diffraction patterns and high quality and high resolution images cannot be obtained at any time. The samples can be rotated flexibly in two dimensions by the double-tilt sample holder (a certain angle tilt in X and Y axis direction at the same time), and the surface appearance and the diffraction patterns of the crystal structure substance can be observed conveniently, and the crystal structure of the samples can be characterized. Usually the Y axis tilt is mainly realized by two modes: (1) Y axis rotation driven by eccentric crankshaft: a small ceramic ball is embedded at the front end of the eccentric crankshaft and stuck in the center of the sample tilt stage slot, and the tilt stage is pushed to realize the tilt in Y axis direction by the rotation of crank and small ball, which is driven by the rotation of the back-end stepping motor. This mode is used in both of Gatan company 646 type and 652 type sample holders. But the mechanical structure and mount used in this mode are complex, and the small diamond ball embedded at the front end is easily damaged; and the tilt mode leads the entire rotation apparatus occupies almost all the interior space of the sample holder, and additional measuring apparatus cannot be installed; in addition, the phenomenon of mechanical clamping easily appears in large angle tilt due to comparatively complex processing structure. (2) Y axis tilt driven by push rod and slant-plane: in the Double-tiltin situ TEM holder with multiple electrical contacts and its application in MEMS-based mechanical testing of nanomaterials Rodrigo A. Bernal et. al designed a double-axis tilt transmission sample holder, the stepping motor connecting push rod moves back and forth to push the front-end slant-plane of tilt stage, which leads the tilt stage rotates around the center tilt axis, and the tilt of Y axis is realized. The mode increases the available space of the front part of the sample holder, which is suitable for the collocation with a variety of MEMS chips, but the tilt angle of Y axis is restricted largely, and in the actual TEM, the tilt angle of Y axis of the samples can only be in the range of the maximum of ±15 degrees. And larger friction force lies between the push rod and the slant-plane increases its mechanical loss degree and affects its service life. (3) Y axis tilt driven by push rod spring mechanism: such as the in-situ double-tilt sample holder for TEM invented by Wang Yiqian et. al from Qingdao University. Stepping motor or exterior rotation apparatus drives horizontal transmission bar to move along horizontal direction, pushes the right end of direction conversion rod to move downward, further drives the holder to rotate anti-clockwise, and the positive and negative tilt of Y axis is realized by the reverse thrust of the spring. The optical fiber and the electrode system can be introduced into the double-tilt sample holder, but its double-tilt push rod and spring also occupy larger volume of the front-end, which is inconvenient for the introduction of other apparatuses, and the stability of the spring is poor and the tilt error is easy to be produced.

CONTENTS OF THE INVENTION

Aiming to the current problems, the purpose of the invention is in that it provides a double-tilt holder r TEM, and its mechanical structure design is simple, convenient in processing, large usable area of the front-end tilt stage, convenient to be coordinated with various sizes of the MEMS chips, convenient to be mounted, and tilt angle can be precisely controlled and low cost. The main body of the sample holder for TEM is made of metal material and is prepared by the method of mechanical processing. Used coordinately with TEM, the material microstructure can be studied in sub angstrom, atomic and nano scale, and selective electron diffraction patterns and high quality and high resolution images can be obtained.

In order to realize the above purpose, the invention is realized by the following technical scheme:

A double-axis tilt sample holder for TEM, characterized in that: it comprise the main body of sample holder body, front-end tilt stage, drive rod, linkage, tilt axis, rotation axis, fixed axis of drive rod and sample loading stage; the sample holder body is divided into three parts, and the linear motor is placed at the back-end, and hollow cylinders are at the middle part and front end;

The whole tilt stage is a bilaterally symmetric structure, a combination of U-shaped structure and a boss, and the boss is a bilaterally symmetric structure, comprising horizontal part and the tilted part at θ angle to the horizontal part, and θ angle is 30-45 degrees; a rotation axis hole is arranged at the back-end of the tilted part; one end of the horizontal part of the boss is provided with a boss slot, and the middle is provided with a through hole convenient for electron beam to pass through; the horizontal part of the boss is embedded between the U-shaped structure, and the fixed axis of drive rod is at one end of the linkage, and the rotation axis is at the other side, and the boss slot is connected to the drive rod slot by the rotation axis and the linkage; the front-end of the sample holder body is provided with corresponding tilt axis connecting hole, the front-end tilt stage is provided with the connecting hole coordinating the tilt axis, and two through movement guide grooves are designed symmetrically at both sides of the front-end of sample holder body, and the fixed axis of drive rod is arranged in the movement guide groove to fix the drive rod, restricting the drive rod to move reciprocally back and forth in a straight line driven by the linear stepping motor, further leading the tilt stage to rotate around the tilt axis.

When the fixed axis of drive rod is at the center position of the guide groove, and the tilt stage is at the horizontal position, and the drive rod is driven by the motor to move forward, the tilt stage tilts toward one side, while the rotation axis is driven by the motor to move backward over the center position and continue moving backward, the sample stage tilts toward the other side.

Further, the rotation axis is rigid axis, the boss at the bottom surface of the front-end tilt stage is at θ angle to the horizontal direction (θ angle=45°, the maximum tilt angle in Y axis can be realized).

Further, the front-end of the sample holder body is provided with a corresponding tilt axis connecting hole, and the front-end tilt stage is provided with a connecting hole coordinated with the tilt axis, and the front ends of the linkage, the boss and the drive rod are respectively provided with the connecting holes coordinated with the rotation axis. The front-end of the main body of sample holder body is provided with a movement guide groove. The drive rod is connected to the linear stepping motor by the plugging glue seal, and the front-end tilt stage is connected to the sample holder body by the tilt axis, and the linkage, the boss and the front-end of the drive rod are respectively connected to the rotation axis, and the front-end of the drive rod is connected to the movement guild groove by the fixed axis of the drive rod. The tilt axis, the rotation axis and the fixed axis of the drive rod are fixedly connected to various connection parts by the mode of welding.

Further, the front-end rotation stage is at θ angle to the movement guide groove, when the fixed axis of the drive rod is at the center position of the guide groove, and the tilt stage is at the horizontal position, and drive rod is driven by the motor to move forward, the tilt stage tilts to one side, while when the rotation axis is driven by the motor to move backward over the center position and continue moving backward, the sample stage tilts to the other side.

Further, the sample loading stage used for loading TEM samples or in-situ MEMS apparatus is connected to the front-end tilt stage by a screw.

Further, the middle of the sample holder body is provided with a through hole coordinated with the drive axis, and the motor is fixed on the holder, the tail end of the holder body is arranged with coaxial cable to ensure vacuum.

The advantages of the invention are in that mechanical structure design is simple, convenient in processing, low cost and large usable area of the front-end double-tilt stage, and can be coordinated with various sizes and functions of in-situ MEMS apparatus. By changing the step value of the linear stepping motor, tilt angle can be controlled precisely and large angle tilt can be realized. The fixed axis of the drive rod is designed at the front-end to ensure the accurate displacement of the drive rod in a straight line and increase the reliability of the tilt precision, which avoids the occurrence of the mechanical clamping phenomenon. The apparatus can be used in general transmission electron microscopes and its universality is wide.

DESCRIPTION OF APPENDED DRAWINGS

Figure 2:
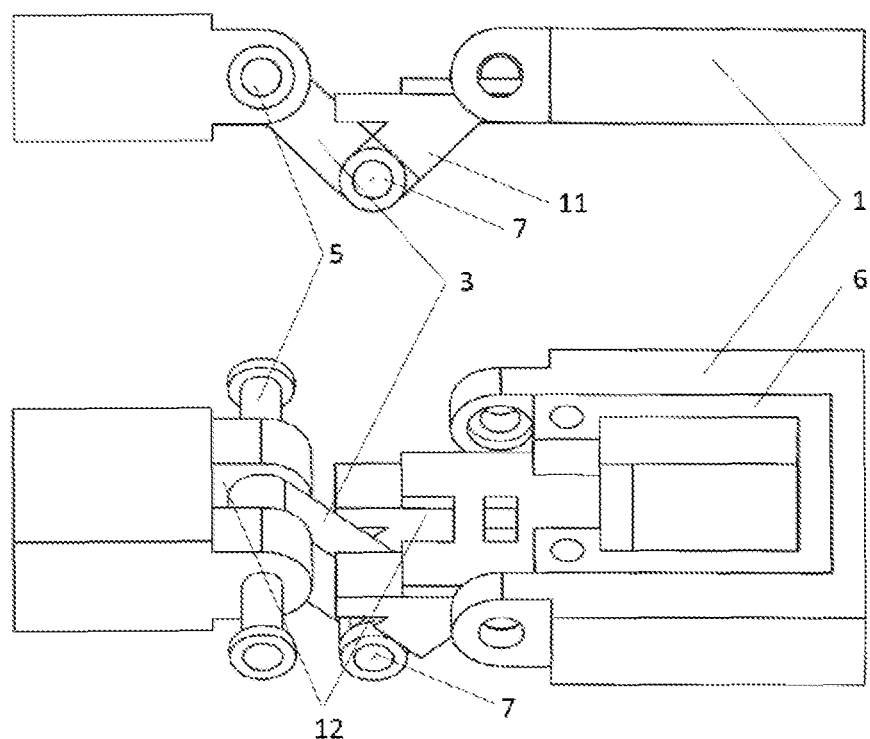
Figure 3:
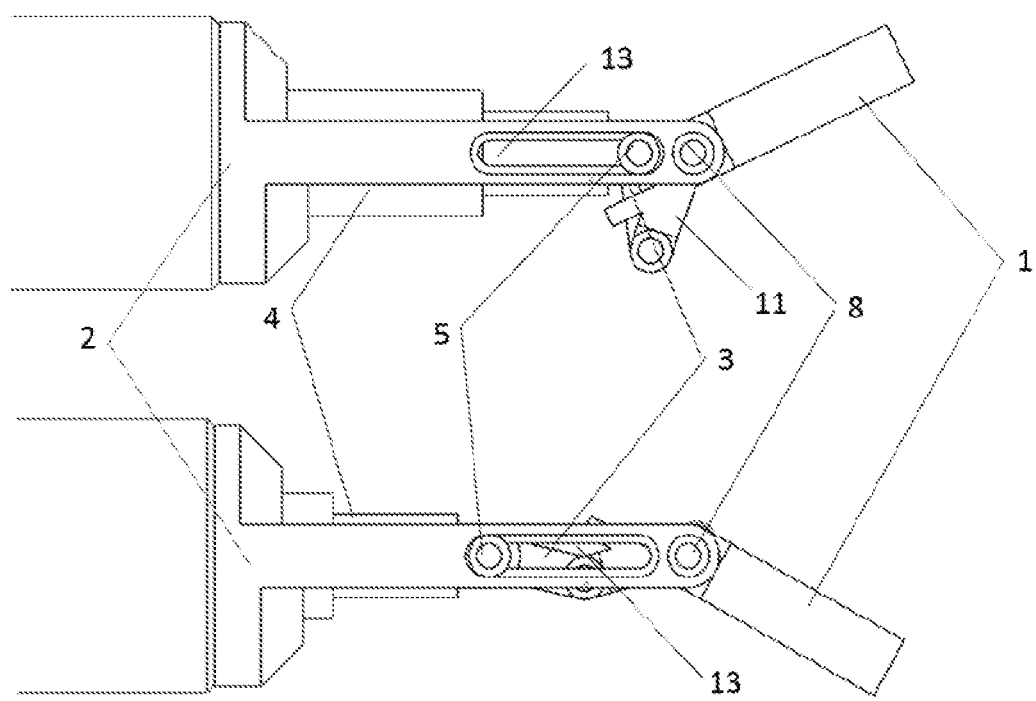

FIG. 1 Schematic diagram of the whole structure of double-tilt sample holder for TEM;

FIG. 2 Schematic diagram of the amplified structure of the front-end of double-tilt sample holder body and the front-end tilt stage;

FIG. 3 Schematic diagram of the front-end tilt stage tilting to a certain positive angle (figure above) or negative angle (figure below).

Figure 4:
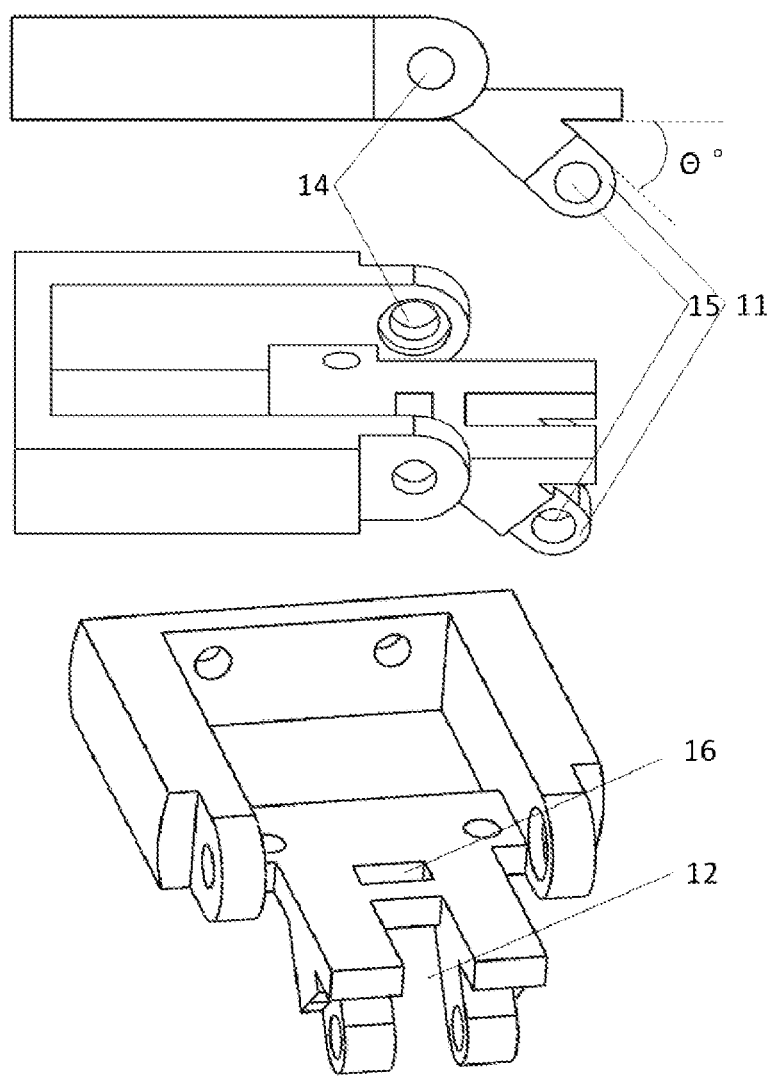
Figure 5:
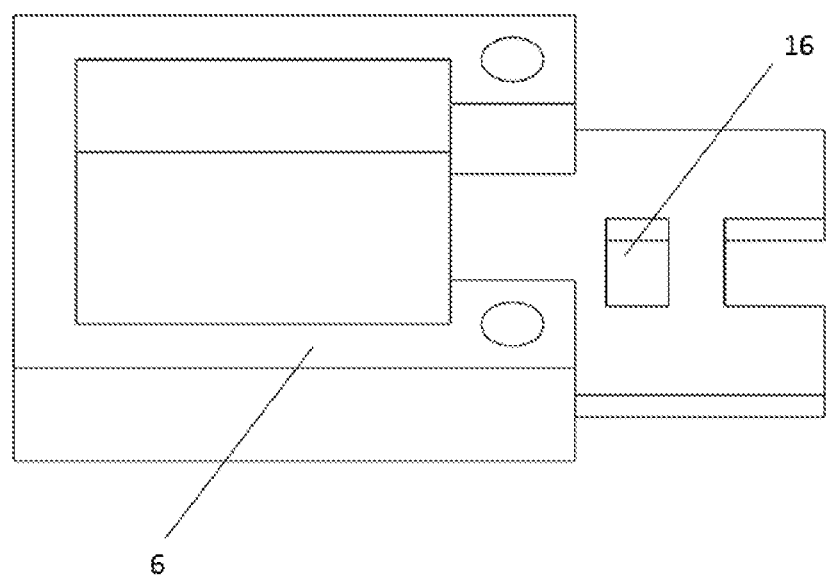

FIG. 4 Schematic diagram of the amplified structure of the front part and the boss;

FIG. 5 Schematic diagram of the amplified structure of the sample loading stage.

The surfaces in the diagrams are illustrated as follows:

1 front-end tilt stage 2 front-end of sample holder body 3 linkage 4 drive rod 5 fixed axis of drive rod 6 sample loading stage 7 rotation axis 8 tilt axis 9 sample holder body 10 linear stepping motor 11 boss 12 boss slot 13 movement guide groove 14 rotation axis hole 15 tilt axis hole 16 through hole for electron beam

DESCRIPTION OF THE PREFERRED EMBODIMENTS

The patent was further illustrated by referring the appended drawings, and the example embodiments of the patent were shown in the appended drawings.

The center of the sample holder body 9 was provided with a through hole coordinating the size of drive rod 4, and linear stepping motor 10 was fixed on the back-end of the sample holder, and a motor lead drew forth the sample holder by the vacuum sealing interface arranged at the tail-end of the sample holder body 9, and the drive rod 4 was connected to the linear stepping motor 10 by the plugging glue seal, and the front-end tilt stage 1 was connected to the front-end of sample holder body 2 by the rigid tilt axis 8, and the boss 11 at the bottom surface of the front-end tilt stage was connected to the linkage 3 by the tilt axis 7, and the linkage 3 and the drive rod 4 were connected together by the fixed axis of rigid drive rod 5, and the fixed axis of drive rod 5 was fixed in the movement guide groove 13 at the front-end of the sample holder body and moved back and forth in a straight line along the movement guide groove 13, and the sample loading stage 6 was fixed on the front-end tilt stage by the screw. The rotation axis 7 was inserted into the rotation axis hole 14, and one end of the rotation axis 7 was fixed by the mode of welding. The tilt axis 8 was inserted into the tilt axis hole 15, and one end of the tilt axis 8 was fixed by the mode of welding.

The drive rod 4 and the linear stepping motor 10 was connected as drive parts, which moved in a straight line by the vertical restriction function of the fixed axis of the drive rod 5 and the movement guide groove, at the same time pushed the connected linkage 3, and drove the front-end tilt stage 1 to rotate centered on the tilt axis 8.

Because the tilt axis 8 and the fixed axis of drive rod 5 are always at the same horizontal plane and on the extension line of the central axis of the sample holder body 9, and when the fixed axis of drive holder 5 is at a certain position of the movement guide groove 13 and the boss 11 at the bottom surface of the front-end of the tilt stage is at 90° angle to the linkage, the front-end tilt stage 1 kept horizontal, that is, the tilt angle of Y axis is 0°. Because the drive rod 4 was connected to the back-end linear stepping motor 10, when the drive rod 4 was driven by the linear stepping motor 10 to move forward, the linkage 3 connected to the drive rod 4 pushed the boss 11 at the bottom surface of the front-end tilt stage 1 to rotate anticlockwise around the tilt axis 8, leading the front-end tilt stage 1 to tilt toward the negative direction (FIG. 3). When the drive rod 4 was driven by the linear stepping motor to move backward, the linkage 3 connected to the drive rod 4 pushed the boss 11 at the bottom surface of the front-end tilt stage 1 to rotate clockwise around the tilt axis 8, leading the front-end tilt stage 1 to tilt toward the positive direction (FIG. 3). The angular dimension is strictly controlled by the length of the movement guide groove 11 and the movement distance of the linear stepping motor 10.

What is claimed is:

1. A double-tilt sample holder for TEM, comprising a sample holder body, a front-end tilt stage, a drive rod, a linkage, a tilt axis, a rotation axis, a fixed axis of the drive rod and a sample loading stage; wherein the sample holder body is divided into three parts, and a linear motor is placed at a back part of the sample holder body, and hollow cylinders are at a middle part and a front part of the sample holder body;

the front-end tilt stage is of a bilaterally symmetric structure, and comprises a combination of a U-shaped structure and a boss, and the boss is of a bilaterally symmetric structure, comprising a horizontal part and a tilted part at θ angle to the horizontal part, and the θ angle is 30-45 degrees; a rotation axis hole is arranged at a back-end of the tilted part; one end of the horizontal part of the boss is provided with a boss slot, and a middle of the horizontal part is provided with a through hole for electron beam to pass through; the horizontal part of the boss is embedded between the U-shaped structure, and the fixed axis of the drive rod is provided at one end of the linkage, and the rotation axis is provided at the other end of the linkage, and the boss is connected to the drive rod by the rotation axis and the linkage; the front part of the sample holder body is provided with a tilt axis connecting hole, the front-end tilt stage is provided with a tilt axis hole aligned with the tilt axis connecting hole and coordinating the tilt axis, and two symmetric and through movement guide grooves are designed at both sides of the front part of the sample holder body, and the fixed axis of the drive rod is arranged in the movement guide grooves to guide the drive rod, restricting the drive rod to move reciprocally back and forth in a straight line driven by the linear stepping motor, further leading the front-end tilt stage to rotate around the tilt axis.

\* \* \* \* \*